(12) United States Patent
Cho

(10) Patent No.: US 6,593,188 B2
(45) Date of Patent: Jul. 15, 2003

(54) NON-VOLATILE MEMORY DEVICE HAVING A SILICIDE LAYER AND FABRICATION METHOD THEREOF

(75) Inventor: Seong-Soon Cho, Kyunggi-do (KR)

(73) Assignee: Samsung Electronics., Ltd., Suwon (KR)

( * ) Notice: Subject to any disclaimer, the term of this patent is extended or adjusted under 35 U.S.C. 154(b) by 0 days.

(21) Appl. No.: 09/957,816

(22) Filed: Sep. 20, 2001

(65) Prior Publication Data

US 2002/0123194 A1 Sep. 5, 2002

(30) Foreign Application Priority Data

Mar. 5, 2001 (KR) .................................... 2001-0011134

(51) Int. Cl.[7] .......................................... H01L 21/8247
(52) U.S. Cl. ...................... 438/258; 438/592; 438/664
(58) Field of Search ................................. 438/258, 264, 438/266, 267, 592, 593, 594, 664

(56) References Cited

U.S. PATENT DOCUMENTS

| | | | |
|---|---|---|---|
| 5,334,545 A | 8/1994 | Caviglia et al. | 438/592 |
| 5,447,875 A | 9/1995 | Moslehi | 438/592 |
| 5,472,892 A | * 12/1995 | Gwen et al. | 438/258 |
| 5,654,219 A | * 8/1997 | Huber | 438/592 |
| 5,731,239 A | 3/1998 | Wong et al. | 438/596 |
| 5,789,294 A | * 8/1998 | Choi | 438/258 |
| 5,869,396 A | 2/1999 | Pan et al. | 438/649 |
| 6,057,218 A | * 5/2000 | Yu et al. | 438/592 |
| 6,107,096 A | 8/2000 | Mikagi | 438/664 |

* cited by examiner

Primary Examiner—Chandra Chaudhan
(74) Attorney, Agent, or Firm—Marger Johnson & McCollom, P.C.

(57) ABSTRACT

A non-volatile memory device and a fabrication method thereof are provided. A first polysilicon layer, an inter-gate dielectric layer, a second polysilicon layer and a capping layer are stacked sequentially. A first opening is formed through the inter-gate dielectric layer, the second polysilicon layer and the capping layer, thereby exposing the first polysilicon layer. A second opening is formed through the capping layer, thereby exposing the second polysilicon layer. On the resultant structure, a metal layer is formed and then thermally treated. As a result a metal silicide layer can be formed on the exposed portion of the first polysilicon layer and the exposed portion of the second polysilicon layer.

24 Claims, 7 Drawing Sheets

NON-VOLATILE MEMORY DEVICE HAVING A SILICIDE LAYER AND FABRICATION METHOD THEREOF

This application relies for priority upon Korean Patent Application No. 2001-11134, filed on Mar. 5, 2001, the contents of which are herein-incorporated by reference in their entirety.

FIELD OF THE INVENTION

The present invention relates to semiconductor devices and fabrication methods thereof and, more particularly, to non-volatile semiconductor memory devices having a silicide layer and fabrication methods thereof.

BACKGROUND OF THE INVENTION

Generally, a flash memory device retains information stored in its memory cells even when no power is supplied. These days, the flash memory device is widely used in various kinds of electronics products such as a mobile telecommunication system, a memory card and so on.

The flash memory device generally comprises a cell array area and a peripheral area. The cell array area comprises a plurality of memory cells organized in a two-dimensional matrix. The peripheral area is generally formed to surround the cell array area. In the peripheral area, there is circuitry for performing a programming operation, a reading operation, an erasure operation and so on. A stacked gate cell is used as a unit cell of a number of flash memory devices with an advantage of its small cell size (surface area). The stacked gate cell has a floating gate electrode and a control gate electrode. Typically, the control gate electrode is stacked on the floating gate electrode.

Recently, an operation speed characteristic is considered important in high-density flash memory devices. For the higher operation speed, it is required to decrease signal delay time, which is induced by high resistance of gate electrodes in a peripheral area and control gate electrodes, i.e. word lines in a cell array area. In general, as an approach to reduce resistance of gate electrodes of MOS transistors, polycide technology has been used in industry. But, there are some problems in applying the polycide technology to flash memory devices, especially where a stacked gate cell is used therein.

One example of the polycide gate electrode technology is disclosed in U.S. Pat. No. 5,869,396 to Pan et al. According to the patent, an insulating layer is formed on a whole surface of a semiconductor substrate having polysilicon patterns. The insulating layer is planarized to expose an upper surface of the polysilicon patterns. A metal suicide layer of low resistance is selectively formed on the exposed upper surface.

As mentioned above, the patented technology is not applicable to fabricating the non-volatile memory devices such as flash memory devices, for following reason. Generally, a flash memory device has both a cell transistor and a select transistor. The select transistor has a single gate structure being different from the cell transistor, which has a stacked gate structure. That means the height of the select transistor is significantly lower than of the cell transistor. In this configuration, it is very difficult by using the patented method to expose both the surface of a gate electrode of the select transistor (i.e. a select line) and the surface of a control gate electrode of the cell transistor simultaneously. That is to say, the surface of the select line is still not exposed, though a planarization process is performed to the extent that the surface of a control gate electrode is exposed.

U.S. Pat. Nos. 5,731,239, 5,334,545, 5,447,875 and 6,107,096, describe methods for selectively forming a metal silicide layer on gate electrodes and/or source/drain regions of MOS transistors having only the single gate structure. These technologies are not applicable also to fabricating the non-volatile memory devices having both the single gate structure and the stacked gate structure on single substrate. The technologies cannot avoid the problems induced by structurally unique aspects of the non-volatile devices including the height difference of the single gate structure and the stacked gate structure.

SUMMARY OF THE INVENTION

It is an object of the present invention to provide a method for forming a non-volatile memory device, which has metal silicide layers of low resistance on a select line and a control gate electrode.

It is an object of the present invention to provide a non-volatile memory device having enhanced operation characteristics, which has metal silicide layers of low resistance on a select line and a control gate electrode.

According to one aspect of the present invention, a method of fabricating a semiconductor device is provided. The method comprises forming a first layer on a substrate. An intervening layer is formed on the first layer. A second layer is formed on the intervening layer. A capping layer is formed on the second layer. A first opening is formed to expose a portion of the first layer. The first opening penetrates the capping layer, the second layer and the intervening layer. A second opening is formed to expose a portion of the second layer. The second opening penetrates the capping layer. A reactive layer is formed on the exposed portion of the first layer, on the exposed portion of the second layer and on the capping layer. The reactive layer is reacted with the exposed portion of the first layer and the exposed portion of the second layer. As a result, a first top layer of a first crystalline structure is formed in the first opening and a second top layer of the first crystalline structure is formed in the second opening. An unreacted portion of the reactive layer remains on the capping layer. The unreacted portion of the reactive layer is removed. The first crystalline structure is transformed to a second crystalline structure. The capping layer is removed. The second layer is etched by using the second top layer as an etching mask. The first layer is etched by using the first and second top layers as etching masks. As a result, first and second patterns are formed under the first and second top layers, respectively. The first pattern comprises the first top layer and the first layer. The second pattern comprises the second top layer, the first layer and the second layer.

According to another aspect of the invention, a non-volatile memory device is provided. The device comprises a gate electrode formed in a peripheral area. The gate electrode is formed of a first polysilicon layer and a first metal silicide layer. The first metal silicide layer is formed on the first polysilicon layer. A control gate electrode is formed in a cell array area. The control gate electrode is formed of a second polysilicon layer and a second metal silicide layer. The second metal silicide layer is formed on the second polysilicon layer. A floating gate electrode is formed under the control gate electrode. The floating gate electrode is formed of the first polysilicon layer. An inter-gate dielectric layer intervenes between the control gate electrode and the floating gate electrode. A select line is formed in the cell array. The select line is formed of the first polysilicon layer and the first metal silicide layer. The first metal silicide layer includes a substantially vertical portion.

Accordingly, it is possible to use metal silicide layers in a non-volatile memory device. Therefore, it is possible to significantly reduce resistance of the gate electrode, the select line and the control gate electrode, thereby enhancing performance of the device.

BRIEF DESCRIPTION OF THE DRAWINGS

Other features of the present invention will be more readily understood from the following detail description of specific embodiment thereof when read in conjunction with the accompanying drawings, in which:

FIGS. 2a through 7a are cross-sectional views illustrating successive process steps for forming a non-volatile memory device according to a present invention, which are taken along a line I–I' of FIG. 1; and FIGS. 2b through 7b are cross-sectional views illustrating successive process steps for forming a non-volatile memory devices according to a present invention, which are taken along a line II–II' of FIG. 1.

DESCRIPTION OF THE PREFERRED EMBODIMENT

Preferred embodiments of the present invention will be described hereinafter with reference to the accompanying drawings, even though the scope of the present invention is not limited to the embodiments.

Figure 1:
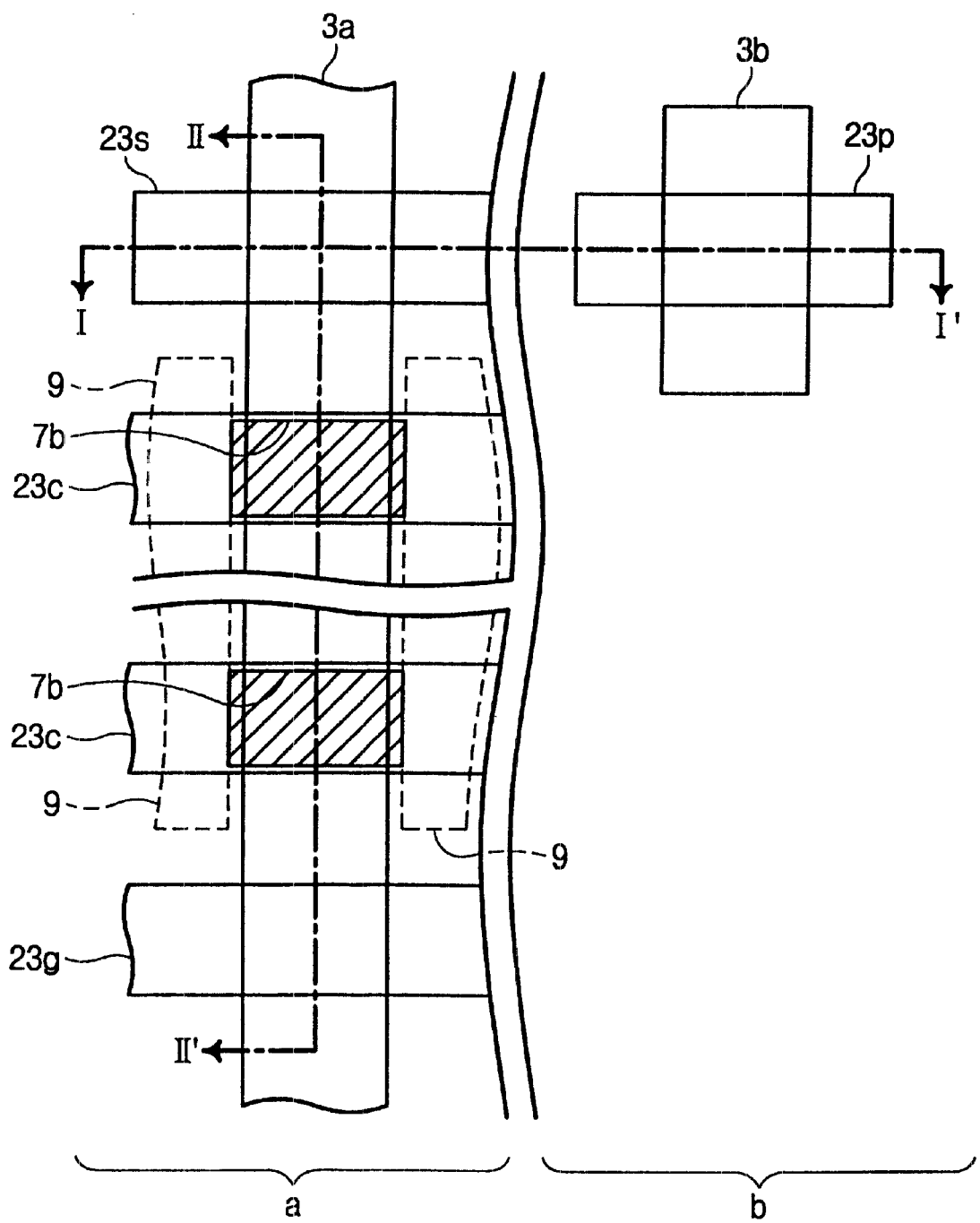
FIG. 1 is a plan view illustrating a non-volatile memory device and a fabricating method thereof according to a present invention.

FIG. 1 is a plan view illustrating a non-volatile memory device and a fabricating method thereof according to the present invention. The reference symbols "a" and "b" indicate a cell array area and a peripheral area, respectively. The plan view itself appears to be substantially similar to a typical plan view in the prior art. But, the vertical structure of it is unique, as described below.

Referring to FIG. 1, a semiconductor substrate has a first active region 3a and a second active region 3b. The first active region 3a is formed in the cell array area "a". The second active region 3b is formed in the peripheral array area "b".

Figure 6A:
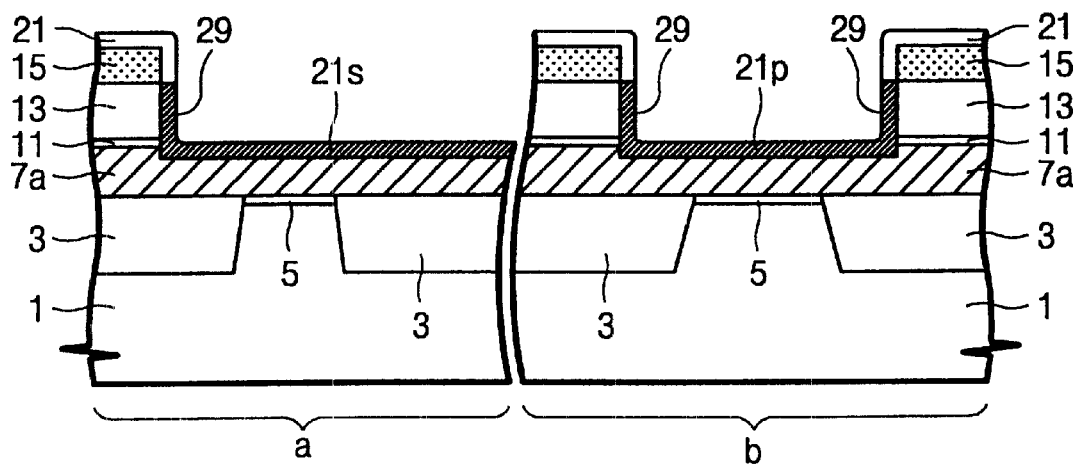
Figure 6B:
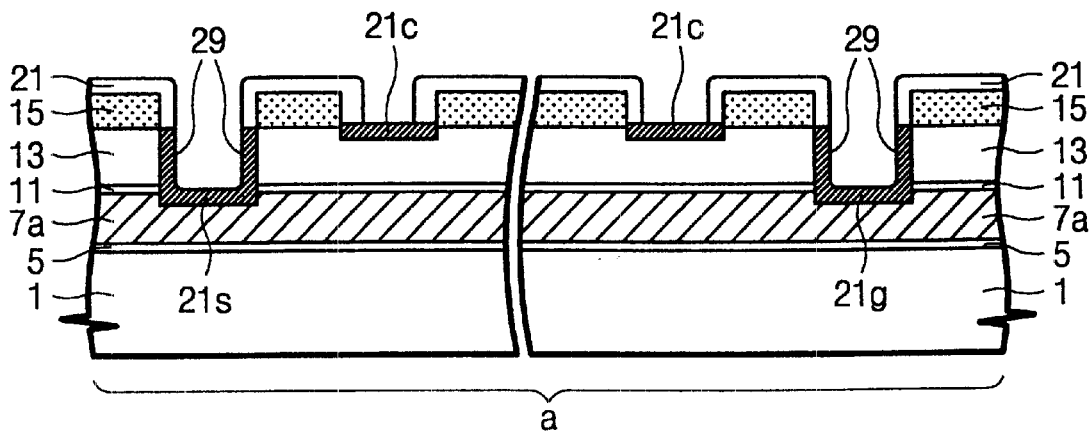
Figure 7A:
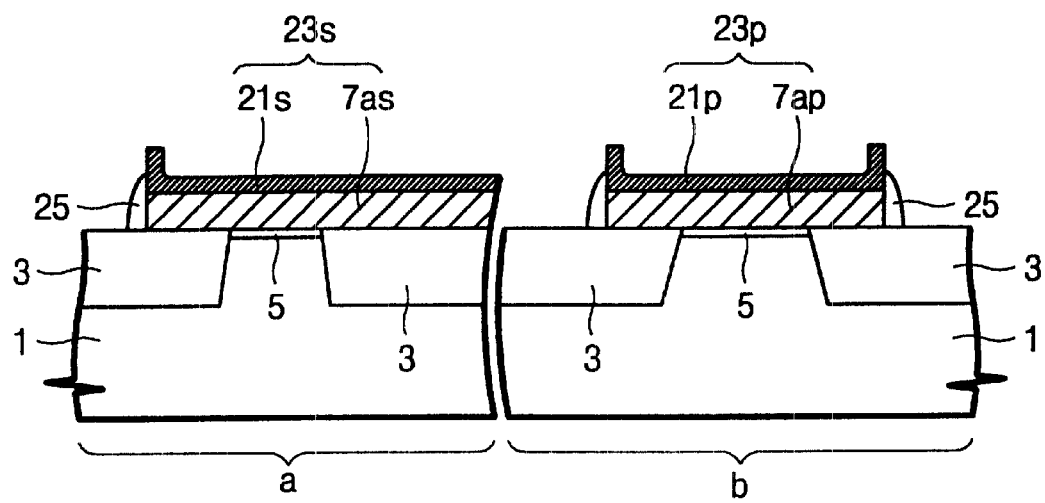
Figure 7B:
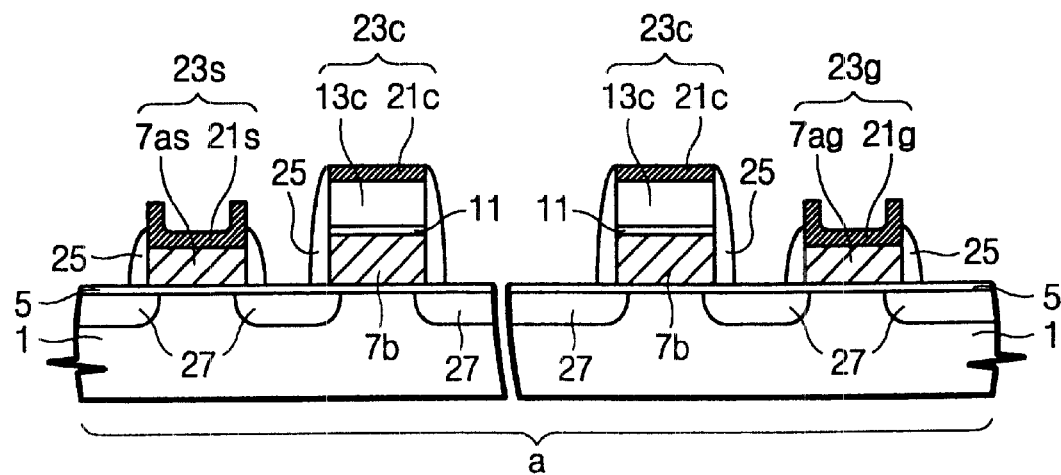

A string select line 23s and a ground select line 23g are formed across a surface of the first active region 3a. Though not shown, the select lines 23s and 23g are formed of a first polysilicon layer and a first metal silicide layer. The first metal silicide layer has a substantially vertical portion 29 (see FIGS. 6A and 6B). The substantially vertical portion 29 is connected to an end of the first metal silicide layer. The first metal silicide layer is stacked on the first polysilicon layer.

Similarly, a gate electrode 23p is formed across the second active region 3b. Though not shown, the gate electrode 23p is formed of the first polysilicon layer and the first metal silicide layer.

A plurality of control gate electrodes 23c are formed between the pair of the select lines 23g and 23s and across the first active region 3a. The control gate electrodes 23c are parallel to each other. Though not shown, the control gate electrodes 23c are formed of a second polysilicon layer and a second metal silicide layer. The second metal silicide layer is formed on the second polysilicon layer. The control gate electrodes 23c act as word lines.

Floating gate electrodes 7b intervene between the control gate electrodes 23c and the first active region 3a. Though not shown, the floating gate electrodes are formed of the first polysilicon layer.

Though not shown, a tunnel oxide layer intervenes between the floating gate electrodes 7b and the first active region 3a. The tunnel oxide layer intervenes also between the select lines 23s and 23g and the first active region 3a. An inter-gate dielectric layer intervenes between the floating gate electrodes 7b and the control gate electrodes 23c. A gate insulating layer intervenes between the gate electrode 23p and the second active region 3b.

The first and second metal silicide layers are preferably formed of a titanium silicide layer or a group-VIII metal silicide layer. The group-VIII metal silicide layer preferably is a cobalt silicide layer, a nickel suicide layer, a palldium silicide layer or a platinum silicide layer. In case of a titanium silicide layer, the first and second metal silicide layers have a crystalline structure of a C-54 phase.

The detailed structure of the device, including the features not shown on the FIG. 1, can be more easily understandable with the following description illustrating a fabrication method thereof.

FIGS. 2a through 7a are cross-sectional views illustrating successive process steps for forming a non-volatile memory device according to the present invention, which are taken along a line I–I' of FIG. 1. FIGS. 2b though 7b are cross-sectional views illustrating successive process steps for forming a non-volatile memory device according to the present invention, which are taken along a line II–II' of FIG. 1. The reference symbols "a" and "b" indicate a cell array area and a peripheral area, respectively.

Figure 2A:
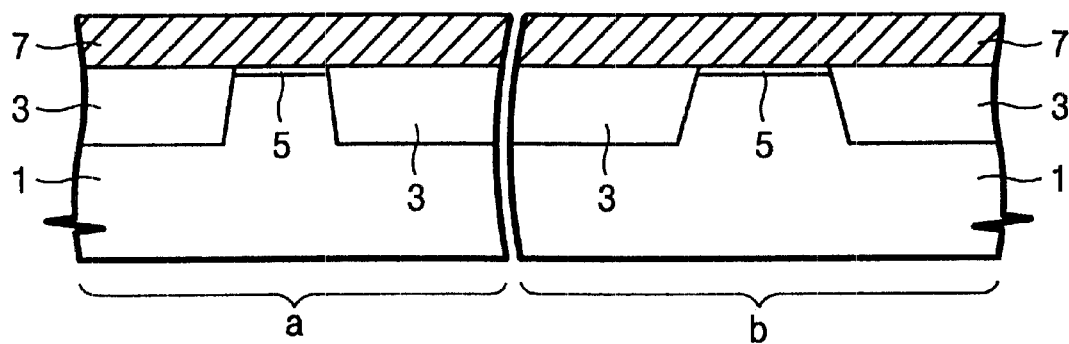
Figure 2B:
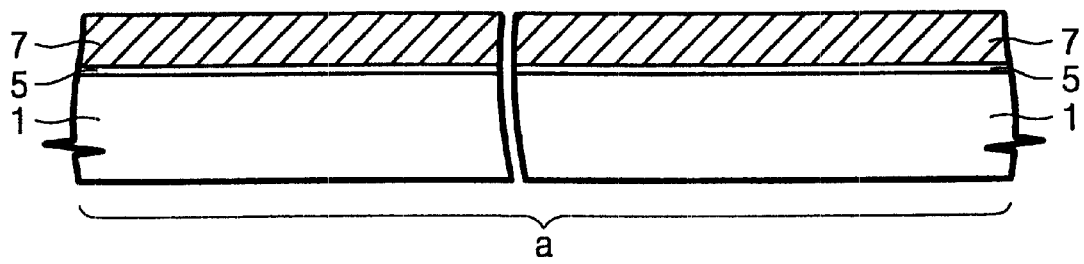

Referring to FIGS. 1, 2a and 2b, isolation regions 3 are formed on a semiconductor substrate to define a first active region and a second active region (3a and 3b of FIG. 1 respectively). The first active region 3a is formed in the cell array area "a". The second active region 3b is formed in the peripheral array area "b". A gate insulating layer 5 is formed on the first and second active regions 3a and 3b. The gate insulating layer 5 may have two different thicknesses by using a well-known method in the art. That is to say, a portion of the gate insulating layer 5 formed on the first active region 3a may be thinner than a portion of the gate insulating 5 layer formed on the second active region 3b. The portion of the gate insulating layer 5 formed on the first active region 3a acts as a tunnel oxide layer, and typically has a thickness less than approximately 100Å.

A first layer 7 is formed on the whole surface of the resultant structure having the gate insulating layer 5. The first layer 7 is a conductive layer, e.g. a first polysilicon layer.

Figure 3A:
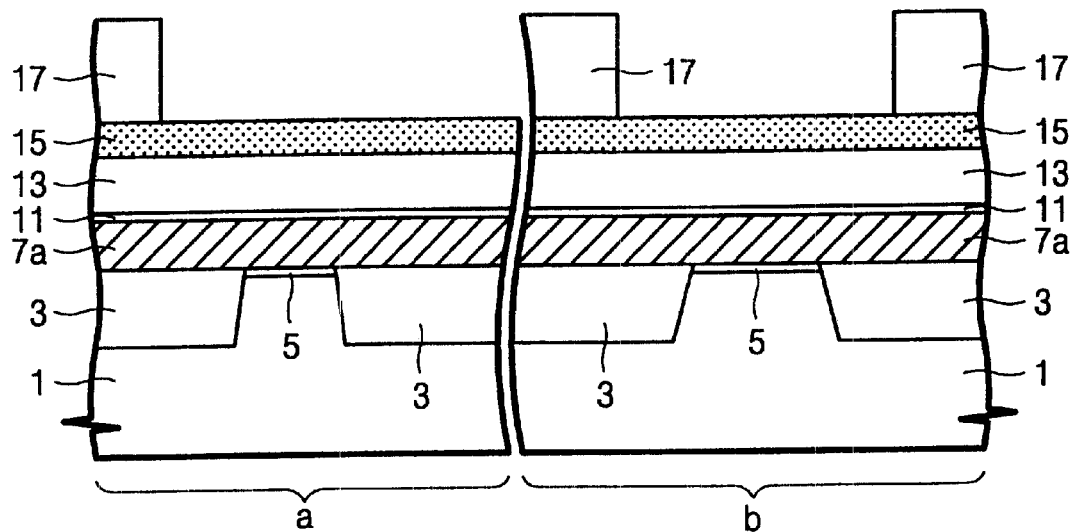
Figure 3B:
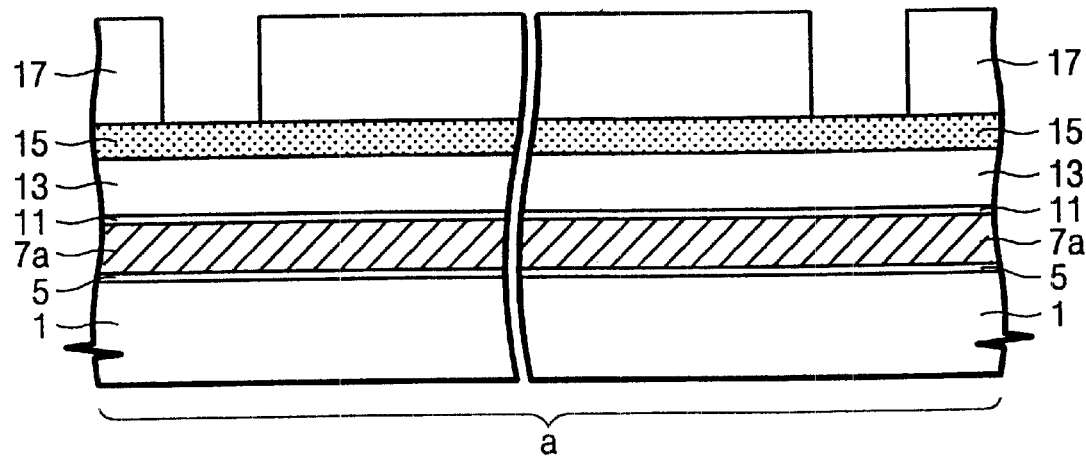

Referring to FIGS. 1, 3a and 3b, the first layer 7 is patterned to remove a portion of the first layer 7, thereby forming a first layer pattern 7a. A reference number 9 in FIG. 1 indicates the removed portion of the first layer 7. The removed portion is not shown in FIGS. 3a and 3b, because the line I–I' and the line II–II' of FIG. 1 are not across the removed portion. As a result, a portion of the isolation regions 3 in the cell array area is exposed by the first layer pattern 7a. An intervening layer, i.e. an inter-gate dielectric layer 11 is formed on the whole surface of the resultant structure having the first layer pattern 7a. A second layer 13 is formed on the inter-gate dielectric layer 11. The second layer 13 is a conductive layer, being preferably a second polysilicon layer. A capping layer 15 is formed on the second layer 13. The capping layer 15 is an insulating layer, being preferably an oxide layer, a nitride layer or combination thereof.

A first photoresist pattern 17 is formed on the capping layer 15. The first photoresist pattern 17 is a reverse pattern to a gate electrode 23p and select lines 23s and 23g. The gate electrode 23p and the select lines 23s and 23g are to be formed at a subsequent process step.

Figure 4A:
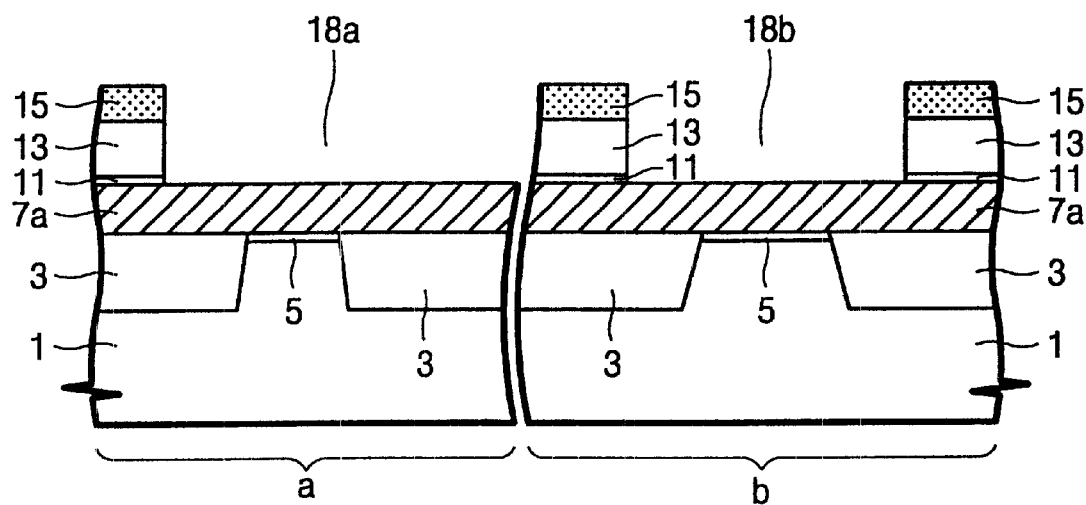
Figure 4B:
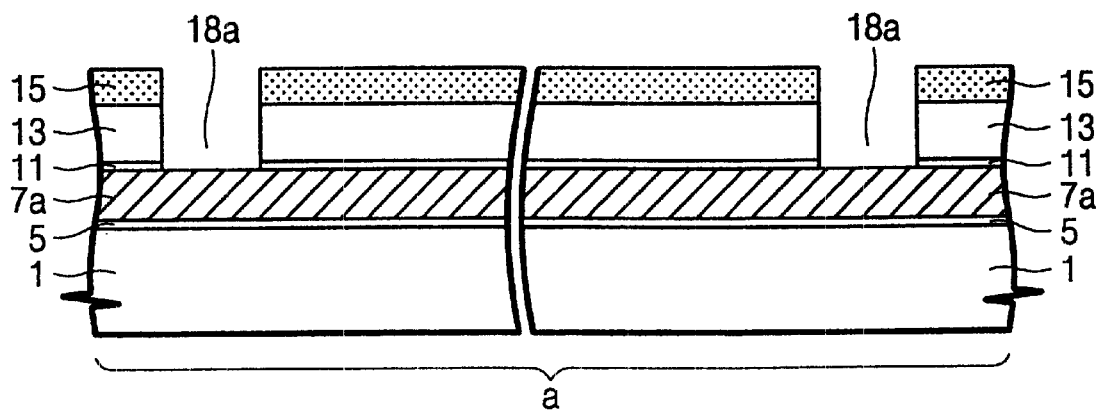

Referring to FIGS. 1, 4a and 4b, the capping layer 15, the second layer 13 and the inter-gate dielectric layer 11 are etched by using the first photoresist pattern 17 as an etching mask, thereby forming first cell openings 18a and a first peripheral opening 18b. A portion of the first layer pattern 7a is exposed by the first openings 18a and 18b. The first cell openings 18a are formed in the cell array area "a", being across the first active region 3a. The first peripheral opening 18b is formed in the peripheral area "b", being across the second active region 3b. Next, the first photoresist pattern 17 is removed.

Figure 5A:
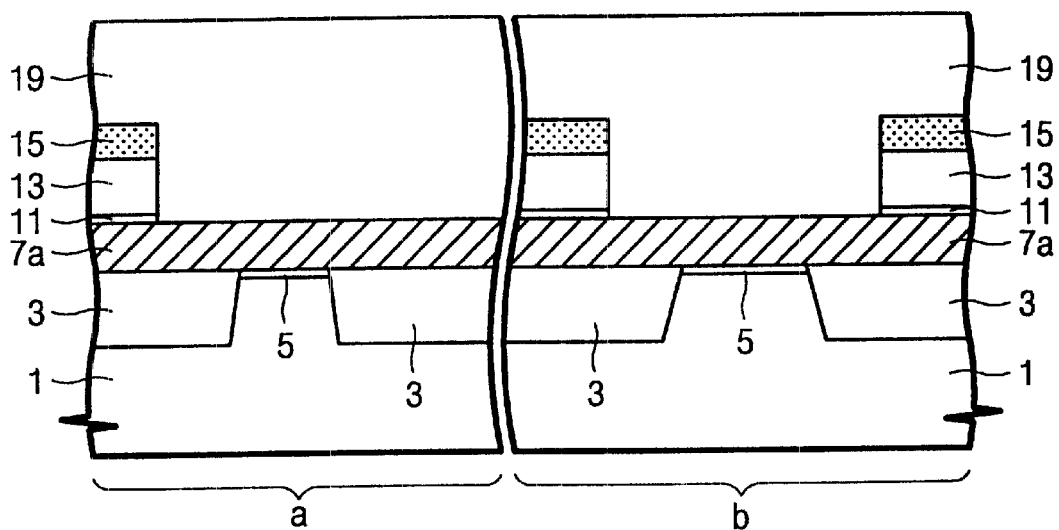
Figure 5B:
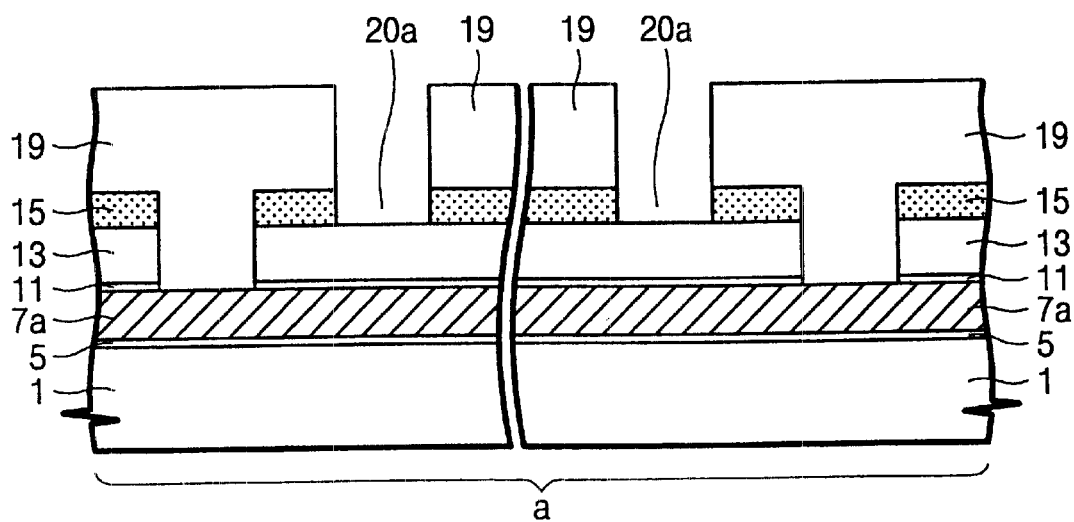

Referring to FIGS. 1, 5a and 5b, a second photoresist pattern 19 is formed on the resultant structure. The second photoresist pattern 19 is a reverse pattern to control gate electrodes 23c, which is to be formed at a subsequent process step. The capping layer 15 is etched by using the second photoresist pattern 19 as an etching mask, thereby forming second openings 20a. A portion of the second layer 13 is exposed by the second openings 20a. The second openings 20a are parallel to the first cell openings 18a and are formed in the cell array area "a". The process steps for forming the second opening 20a may be performed prior to the process steps for forming the first openings 18a and 18b.

Referring to FIGS. 1, 6a, 6b, 7a and 7b, the second photoresist pattern 19 is removed. As described in the drawings, a first top string layer 21s, a first top ground layer 21g and a first top peripheral layer 21p are selectively formed on a surface of the exposed portion of the first layer pattern 7a. And, second top layers 21c are selectively formed on a surface of the exposed portion of the second layer pattern 13. The first top layers 21s, 21g and 21p have substantially vertical portions 29. The substantially vertical portion 29 is connected to an end of the first top layer. The first top layers 21s, 21g, 21p and the second top layer 21c are metal silicide layers formed by a well-known salicidation process. Preferably, the first top layers 21s, 21g, 21p and the second top layer 21c are formed of a titanium silicide layer or a group-VIII metal silicide layer. The group-VIII metal silicide layer preferably is a cobalt suicide layer, a nickel silicide layer, a palldium silicide layer or a platinum silicide layer.

Especially, in case the first top layers 21s, 21g, 21p and the second top layer 21c are formed of a titanium silicide layer, they are preferably formed as described below. A reactive layer 21 is formed on a whole surface of the resultant structure, from which the second photoresist pattern 19 is removed. The reactive layer 21 is a metal layer, i.e. a titanium layer. A first thermal treatment is performed at a first temperature, preferably within a range of approximately 450 to 670° C., thereby reacting the reactive layer 21 with the exposed portion of the second layer pattern 13 and the exposed portion of the first layer pattern 7a. As a result, the first top layers 21s, 21g, 21p and the second top layer 21c are formed on the exposed portion of the first layer pattern 7a and on the exposed portion of the second layer pattern 13, respectively.

The first top layers 21s, 21g, 21p and the second top layer 21c are titanium silicide layers having a crystalline structure of C-49 phase. An unreacted portion of the reactive layer 21, which remains on the capping layer 15, is selectively removed by using a chemical, e.g. a mixture of de-ionized water, hydrogen peroxide ($H_2O_2$) and ammonium hydroxide ($NH_4OH$), thereby exposing the capping layer 15. A second thermal treatment is performed at a second temperature that is higher than the first temperature. The second temperature is preferably within a range of approximately 700 to 870° C. As a result, the crystalline structure of C-49 phase is transformed into the crystalline structure of C-54 phase. The crystalline structure of C-54 phase has a significantly lower resistivity than the crystalline structure of C-49 phase.

Especially, in case the first top layers 21s, 21g, 21p and the second top layer 21c are formed of a cobalt silicide layer, they are preferably formed as described below. A reactive layer 21 is formed on a whole surface of the resultant structure, from which the second photoresist pattern 19 is removed. The reactive layer 21 is a metal layer, i.e. a cobalt layer. The resultant structure is thermally treated at a selected temperature, preferably within a range of approximately 400 to 1000° C., thereby reacting the reactive layer 21 with the exposed portion of the second layer pattern 13 and the exposed portion of the first layer pattern 7a. As a result, the first top layers 21s, 21g, 21p and the second top layer 21c are formed on the exposed portion of the first layer pattern 7a and on the exposed portion of the second layer pattern 13, respectively. The first and second top layers 21s, 21g, 21p and 21c are cobalt silicide layers. An unreacted portion of the reactive layer 21, which remains on the capping layer 15, is selectively removed by using a chemical, e.g. a mixture of hydrochloric acid (HCl) and hydrogen peroxide ($H_2O_2$), thereby exposing the capping layer 15.

The vertical portions 29 of the first top layers 21s, 21g and 21p are induced by a reaction on the sidewalls of the first openings 18a and 18b. That is, the sidewalls of the first openings 18a and 18b have a vertically exposed portion of the second layer 13. This is because the first openings 18a and 18b penetrate the second layer 13. The vertically exposed portion of the second layer 13 also reacts with the reactive layer 21 during the above mentioned salicidation process, thereby leaving the vertical portions 29 on the sidewalls.

The exposed capping layer 15, the second layer 13, the inter-gate dielectric layer 11 and the first layer pattern 7a are continuously etched by using the first and second top layers 21s, 21g, 21p and 21c as etching masks. As a result, a first layer select stripe 7as, a first layer ground stripe 7ag and a first layer peripheral stripe 7ap are formed under the first top layers 21s, 21g and 21p, respectively. And, second layer stripes 13c are formed under the second top layers 21c. Moreover, the floating gate electrodes 7b mentioned above are formed between the second layer stripes 13c and the first active region 3a. The floating gate electrodes 7b are formed of the first layer pattern 7a, i.e. the first layer 7.

The first top string layer 21s and the first layer string stripe 7as constitute a string select line 23s. The first top ground layer 21g and the first layer ground stripe 7ag constitute a ground select line 23g. The first top peripheral layer 21p and the first peripheral layer 7ap constitute the gate electrode 23p mentioned above. The second top layers 21c and the second layer stripes 13c constitute the control gate electrodes 23c mentioned above. A pair of the control gate electrode 23c and the floating gate electrode 7b constitutes a stacked gate.

Referring to FIGS. 7a and 7b again, by using a well-known process, spacers 25 are formed on sidewall of the string select line 23s, the ground select line 23g, the gate electrode 23p and the stacked gates. Source/drain regions 27 are formed in the active regions 3a and 3b, being adjacent to the string select line 23s, the ground select line 23g, the gate electrode 23p and the stacked gates.

According to the present invention, metal silicide layers can be formed on the select lines, the gate electrode and the control gate electrodes. That is to say, it is possible to use metal silicide layers in a non-volatile memory device. Therefore, it is possible to significantly reduce resistance of the gate electrode, the select line and the control gate electrode, thereby enhancing performance of the device.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A method of fabricating a semiconductor device, comprising the steps of:
    forming a first layer on a substrate;
    forming a second layer on the first layer;
    forming a capping layer on the second layer;
    forming a first opening exposing a portion of the first layer, wherein the first opening penetrates the capping layer and the second layer;
    forming a second opening exposing a portion of the second layer, wherein the second opening penetrates the capping layer;
    forming a reactive layer on the exposed portion of the first layer, the exposed portion of the second layer and on the capping layer; and
    reacting the reactive layer with the exposed portion of the first layer and the exposed portion of the second layer, thereby forming a first top layer of a first crystalline structure in the first opening, forming a second top layer of the first crystalline structure in the second opening and leaving a remnant unreacted portion of the reactive layer on the capping layer.

2. The method of claim 1, wherein the first and second layers are polysilicon layers.

3. The method of claim 1, wherein the capping layer is a material selected from the group consisting an oxide layer, a nitride layer and combinations thereof.

4. The method of claim 1, wherein the reactive layer is a metal layer selected from the group consisting a titanium layer and a group-VIII metal layer.

5. The method of claim 1, wherein the step of reaction is performed by a thermal treatment.

6. The method of claim 5, wherein the thermal treatment is performed within a range of approximately 400 to 1000° C.

7. The method of claim 6, wherein the reactive layer is a cobalt layer.

8. The method of claim 1, wherein the top layers are metal silicide layers.

9. The method of claim 1, which further comprises the step of forming an intervening layer on the first layer, wherein the second openings penetrate the intervening layer.

10. The method of claim 9, wherein the intervening layer is a dielectric layer.

11. The method of claim 1, wherein the step of forming the first opening is performed after the step of forming the second opening.

12. The method of claim 1, which further comprising the steps of:
    removing the unreacted portion of the reactive layer;
    removing the capping layer;
    etching the second layer using the second top layer as an etching mask;
    etching the first layer using the first and second top layers as etching masks, thereby forming first and second patterns under the first and second top layers respectively, wherein the first pattern comprises the first top layer and the first layer, wherein the second pattern comprises the second top layer, the first layer and the second layer.

13. The method of claim 12, wherein the first pattern is a select line of a non-volatile memory device.

14. The method of claim 12, wherein the first pattern is a gate electrode in a peripheral area of a memory device.

15. The method of claim 12, wherein the first and second layers of the second pattern respectively constitute a floating gate electrode and a control gate electrode of a non-volatile memory device.

16. The method of claim 12, which further comprises the step of transforming the first crystalline structure into a second crystalline structure.

17. The method of claim 16, wherein the reactive layer is a titanium layer, wherein the first crystalline structure has a C-49 phase, wherein the second crystalline structure has a C-54 phase.

18. The method of claim 16, wherein the step of reacting and the step of transforming respectively are performed by thermal treatments within a range of approximately 450 to 670° C. and a range of approximately 670 to 700° C.

19. A method of fabricating a semiconductor device, comprising the steps of:
    forming a material layer on a substrate;
    forming a first opening in the substrate;
    forming a second opening in the substrate, wherein the first opening is deeper than the second opening;
    forming a first mask on the bottom surface of the first opening;
    forming a second mask on the bottom surface of the second opening; and
    etching a portion of the material layer using the masks, thereby forming a first etched feature under the first mask and second etched feature under the second mask.

20. The method of claim 19, wherein the material layer is a composite layer formed of more than one layer.

21. The method of claim 20, wherein the composite layer comprises a conductive layer.

22. The method of claim 20, wherein the composite layer comprises an uppermost capping layer and is formed of one selected from the group consisting of an oxide layer, a nitride layer and combinations thereof.

23. The method of claim 19, wherein the masks are formed of a metal silicide layer.

24. The method of claim 19, wherein the masks have a substantially vertical portion at an end of the mask.

* * * * *

UNITED STATES PATENT AND TRADEMARK OFFICE
CERTIFICATE OF CORRECTION

PATENT NO.     : 6,593,188 B2
DATED          : July 15, 2003
INVENTOR(S)    : Cho It is certified that error appears in the above-identified patent and that said Letters Patent is hereby corrected as shown below:

Column 1,
Line 50, "suicide" should read -- silicide --.

Column 4,
Line 12, "nickel suicide" should read -- nickel silicide --.

Column 5,
Line 42, "cobalt suicide" should read -- cobalt silicide --.

Signed and Sealed this

Sixteenth Day of September, 2003

JAMES E. ROGAN
*Director of the United States Patent and Trademark Office*